United States Patent [19]

Farnsworth et al.

[11] 3,931,528

[45] Jan. 6, 1976

[54] PULSE GENERATOR FOR REACTIVE LOADS

[75] Inventors: Robert P. Farnsworth, Los Angeles; Robert D. Washburn, Malibu, both of Calif.

[73] Assignee: Hughes Aircraft Company, Culver City, Calif.

[22] Filed: Aug. 23, 1974

[21] Appl. No.: 500,214

[52] U.S. Cl. .................................. 307/108; 320/1
[51] Int. Cl.² ............................................. H03K 3/00
[58] Field of Search ........... 307/106, 107, 108, 109, 307/110, 260, 269; 320/1

[56] References Cited
UNITED STATES PATENTS

| | | | |
|---|---|---|---|
| 2,811,654 | 10/1957 | Dodds | 307/108 |
| 3,309,541 | 3/1967 | Baker | 307/108 |
| 3,371,232 | 2/1968 | Hannan et al. | 307/110 X |
| 3,703,661 | 11/1972 | Le Goff | 320/1 |

Primary Examiner—Robert K. Schaefer
Assistant Examiner—M. Ginsburg
Attorney, Agent, or Firm—W. H. MacAllister; Lawrence V. Link, Jr.

[57] ABSTRACT

A pulse generator adapted for providing electrical pulses to a reactive load circuit. First and second energy storage circuits are coupled to the reactive load circuit and to each other by means of switching devices such that energy initially stored within the first energy storage circuit is sequentially circulated to the reactive load, then to the second energy storage circuit and back to the first energy storage circuit. In accordance with a second embodiment of the invention which is especially adapted for high repetition rate applications, a plurality of the above described pulse producing circuits are coupled in parallel and are controlled to operate in multiphase operational cycles so that each section produces one output pulse during each operational cycle.

19 Claims, 5 Drawing Figures

PULSE GENERATOR FOR REACTIVE LOADS

BACKGROUND OF THE INVENTION

This invention relates generally to pulse generators and is particularly adapted for providing high repetition rate pulse trains with rapid transition on leading and trailing pulse edges and having a readily controllable duty factor.

In many applications it is necessary to provide pulse trains of signals having a high repetition frequency, rapid pulse rise and fall times and substantial energy content. One example of such application is the pulse train used to drive the electro-optical switch in high pulse rate laser units. Prior approaches to producing such pulse trains include the discharging of a pulse forming network through a silicon controlled rectifier (SCR) and a pulse transformer to the load circuit. This approach has the disadvantage of no or minimal control of the duty factor of the pulses which are produced and is generally limited to producing pulse trains of relatively low repetition rates. Another approach which has been implemented to provide such pulse trains is to use transistors either as normal pulse amplifiers or in their avalanche mode to generate a signal which is transformer coupled to the load circuit. However, in accordance with this just mentioned technique the use of conventional transistors results in pulses whose rise and fall times are too slow for many applications, while the use of avalanche type transistor switches suffers from poor duty factor control and low repetition rates.

SUMMARY OF THE INVENTION

A primary object of the subject invention is to provide an improved pulse generator for reactive loads which is capable of producing pulses having rapid rise and fall times.

Another object of the invention is to provide a pulse generator capable of producing pulses with duty factors approaching 100% and which is not limited as to its duty factor by normal circuit constraints.

A further object of the invention is to provide an improved pulse generator capable of high repetition rate operation and whose repetition rate is limited only by the rise and fall times of the pulses.

Yet another object of the invention is to provide an improved pulse generator having high efficiency in terms of the total input power compared to the amount of energy being transferred into and out of the load circuit.

According to one preferred embodiment of the subject invention, first and second energy storage circuits are coupled to a reactive load circuit and to each other by switching devices which are controlled in such a manner that a charge initially stored in one of the energy storage circuits is sequentially circulated to said reactive load circuit, then to the other energy storage circuit and back to the first energy stored circuit. The duration of the pulse applied to the reactive load circuit is determined by control of the switching devices; and rapid rise and fall times for the output pulses are achieved by implementation of resonant charging for the transfer of energy between the energy storage circuits and the reactive load circuit. Increased stability is provided by the use of clamping circuits coupled to one of the energy storage circuits so as to insure that the energy stored therein is within a preselected range of values. Energy losses occurring in the pulse generator are compensated for by means for periodically supplementing the charged stored within one of the energy storage circuits.

In accordance with another embodiment of the invention pulse trains of very high repetition rates may be produced by implementing a plurality of pulse producing sections with each section comprising first and second energy storage circuits; means for applying an initial charge to the first energy storing circuit; a first switching device coupled between the first energy storing circuit and the reactive load; a second switching device coupled between the reactive load and the second energy circuit and a third switching device coupled between the first and second energy storage circuits. Switch control means control the switching devices in each of the pulse producing sections such that the first switching device in each section is conductive during a plurality of different sequential time periods, the second switching device in each of the pulse producing section is conductive during different sequential time periods and the third switching device in each of the plurality of pulse producing sections is conductive during different sequential time periods. In this manner the charge initially stored in the first energy storage circuit of a particular pulse producing section is sequentially circulated to the reactive load circuit, then to the corresponding second energy storage circuit and then back to the corresponding first energy storing circuit. The timing of the switch control signals is such that each of the pulse producing sections provides one pulse to the reactive load during the interval between the enabling of its first and second switching devices and each of the sections provide one pulse to the reactive load during a complete cycle of operation of all of the sections.

In the disclosed embodiments the energy storage sections and the reactive load exhibit capacitive reactance and resonant charging during energy transfer between these devices is implemented by means of inductors coupled in the paths for transferring the energy between the devices. The switches between the various energy storage sections and the reactive load are implemented by means of silicon controlled rectifiers with transformer coupling between the gate and cathode terminals thereof. The unidirectional transfer of energy within the device is further insured by incorporation of diodes in series with each of the switching devices.

BRIEF DESCRIPTION OF THE DRAWINGS

The novel features of this invention, as well as the invention itself, will be better understood from the accompanying description taken in conjunction with the accompanying drawings in which like reference characters refer to like parts and in which.

DESCRIPTION OF THE PREFERRED EMBODIMENTS

Figure 1:
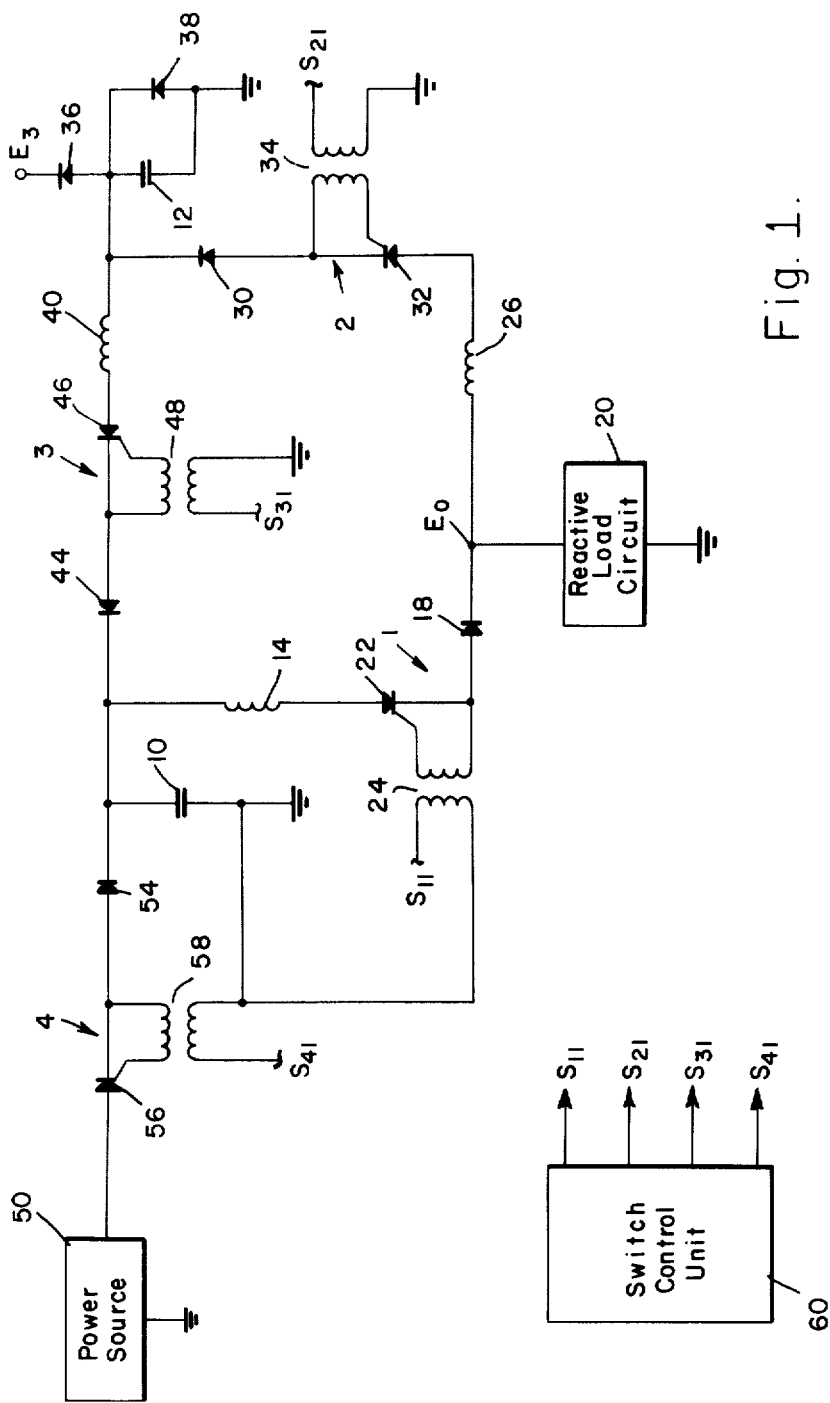
FIG. 1 is a block and schematic diagram of one preferred embodiment of the subject invention.

Referring first primarily to FIG. 1, as there shown, first and second energy storage circuits are implemented by means of capacitors 10 and 12, respectively. Capacitor 10 is coupled through an inductor 14, a switching device 1 and a diode 18 to a reactive load designated 20. Switching device 1 comprises a high speed SCR 22 having the secondary winding of a transformer 24 coupled across its gate and cathode terminals. Reactive load 20 may be an electro-optical switch such as a Pockels cell used within a high repetition rate laser unit, for example. Other examples of reactive loads suitable for being energized by pulse generators in accordance with the subject invention include "magic resonant line modulators," and switchable color filters such as the type adapted for use in liquid crystal display units.

The reactive load 20 is coupled through an inductor 26, a switch device 2, and diode 30 to capacitor 12 of the second energy storing circuit. Switch 2 comprises an SCR 32 having the secondary winding of a transformer 34 coupled between its gate and cathode terminals.

A diode 36 is coupled between capacitor 12 and a positive reference potential source designated $E_3$; and a diode 38 is coupled between capacitor 12 and ground. The circuitry associated with diodes 36 and 38 function as a clamp circuit and adds stability to the subject pulse generator by preventing oscillatory type energy build-up on capacitor 12. With the clamping circuit of FIG. 1, the potential on capacitor 12 cannot exceed the voltage of source $E_3$ by more than the forward voltage drop of diode 36 nor can the potential on capacitor 12 become more negative than the forward drop of diode 38.

Capacitor 12 is also coupled through an inductor 40, a switching device 3 and a diode 44 to the upper terminal of capacitor 10. Switching device 3 includes an SCR 46 having the secondary winding of a transformer 48 coupled between its gate and cathode terminals.

A DC power source 50 is coupled through a switching device 4 and a diode 54 to capacitor 10. Switching device 4 includes an SCR 56 which has the secondary winding of a transformer 58 coupled between its gate and cathode terminals. Switches 1, 2, 3 and 4 are controlled by signals $S_{11}$, $S_{21}$, $S_{31}$, and $S_{41}$, respectively, applied from a switch control unit 60. The control signals from unit 60 are shown in waveform 62 of FIG. 3.

For explaining the operation of the pulse generator of FIG. 1, it is convenient to assume that capacitor 10 is initially charged to a value representing or related to the amount of charge to be placed on reactive load 20, which could be a Pockels cell of the type used in laser devices, for example. Switch 1 is enabled, i.e., switched to a conductive state, in response to the application of the signal $S_{11}$ applied to the primary winding of transformer 24 at the time reactive load 20 is to be energized and results in transferring the charge from capacitor 10 by means of resonant charging to the capacitance of the reactive load. As used herein, the term "resonant charging" refers to the circuit condition wherein the energy stored in a capacitive device is transferred to a second capacitive device through an intermediate inductive device. The current flow through the devices is essentially a half sine wave, and for equal value capacitive devices and for zero circuit resistance, the energy transfer is complete, the efficiency is 100% and the peak current is controlled. The peak current is related to the rise time of the voltage across the load device and can be chosen by selection of the correct inductor value.

After the charge from capacitor 10 is transferred to the Pockels cell, diode 18 and SCR 22 become back-biased. No further action occurs and the voltage on the Pockels cell remains in the "pulse present" condition until terminated by the triggering of switching device 2, i.e., switching the device to its conductive state. In response to the application of trigger pulse $S_{21}$ to the primary winding of transformer 34, switch 2 is made conductive and the charge from the Pockels cell is transferred by resonant charging into capacitor 12. This results in the voltage on the Pockels cell returning to zero and except for losses, the voltage on capacitor 12 is equal to the voltage initially stored on capacitor 10. In response to trigger pulse $S_{31}$ applied to switch 3 the energy from capacitor 12 is transferred by resonant charging back to capacitor 10. Prior to the generation of the next output pulse, any losses within the system may be compensated for by a supplemental charge added to capacitor 10 by means of power source 50 and switching device 4. As shown in waveform 62 of FIG. 3, switch 4 is enabled, i.e., made conductive, prior to the second output pulse by application of the trigger pulse $S_{41}$ to the primary winding of transformer 58. It is noted that power source 50 may also be used to initially apply energy to capacitor 10.

In the embodiment of FIG. 1 the just described sequence of operation is repeated sequentially such that switches 1, 2, 3, and 4 are conductive during first, second, third, and fourth sequential timing periods and as a result thereof the charge initially stored on capacitor 10 is sequentially circulated to the reactive load and then to capacitor 12 and finally back to capacitor 10. The duration of pulse supplied to the reactive load, e.g. Pockels cell, is determined by the interval between trigger pulses $S_{11}$ and $S_{21}$.

Figure 2:
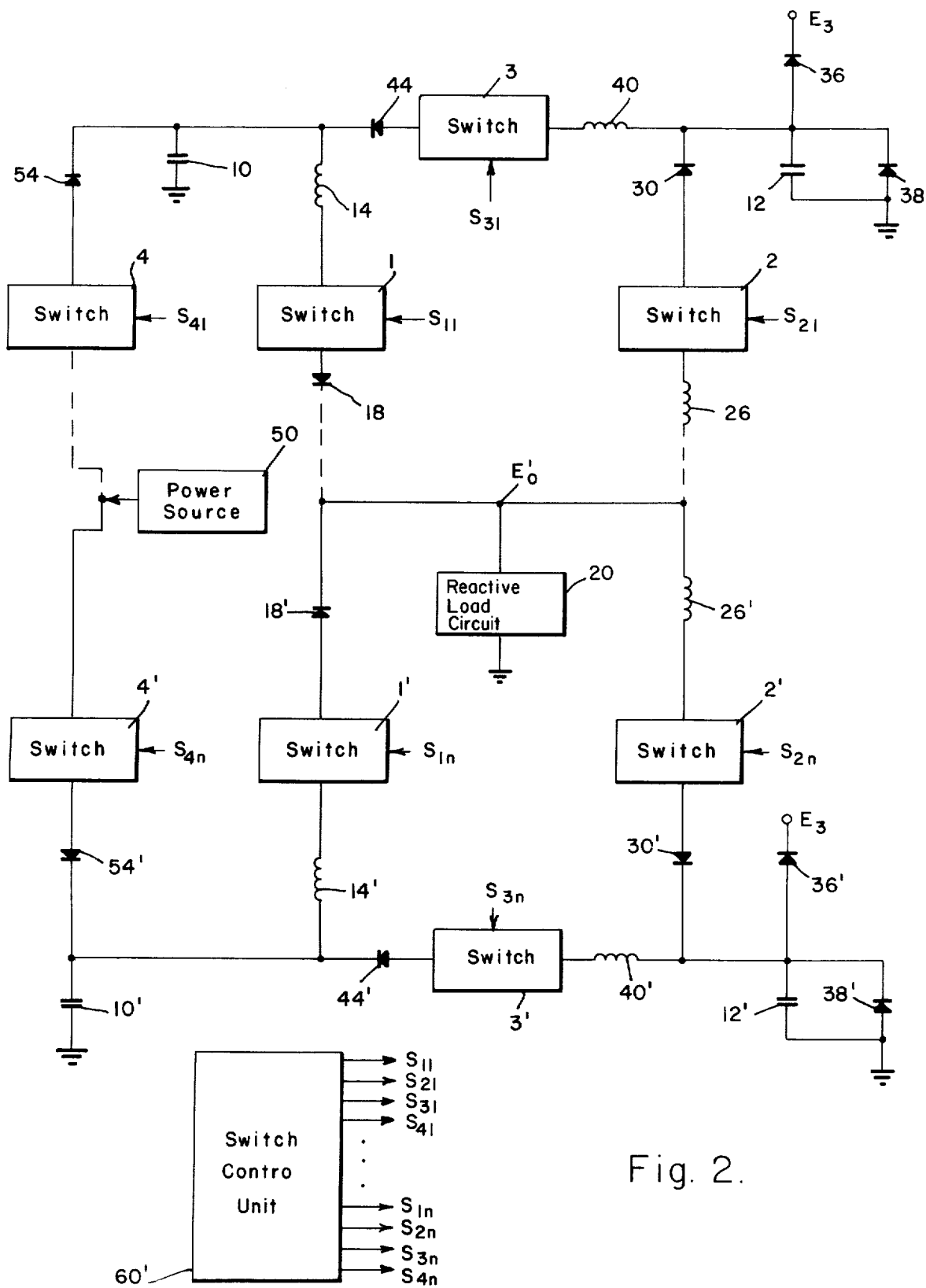
FIG. 2 is a block and schematic diagram of a second embodiment of the subject invention wherein multiphase operation is implemented so as to allow a higher repetition frequency for the train of output pulses.

For applications requiring higher pulse repetition rates than can be conveniently implemented by the one phase system of FIG. 1, the embodiment of FIG. 2 is recommended. In the embodiment of FIG. 2 a plurality of pulse producing sections, each of which are substantially identical to the section shown in FIG. 1, are implemented in a multiphase configuration. In the interest of maintaining clarity of the drawing only two such sections, i.e. $\phi_1$ and $\phi_n$ are shown in FIG. 2. However, it will be understood that as many such sections can be implemented as required for a given pulse repetition rate. In FIG. 2, the elements of pulse producing sections $\phi_1$ are given the same reference numeral as corresponding elements of FIG. 1; while the elements of section $\phi_n$ are identified in FIG. 2 by corresponding reference numerals with the addition of a prime superscript.

Figure 3:
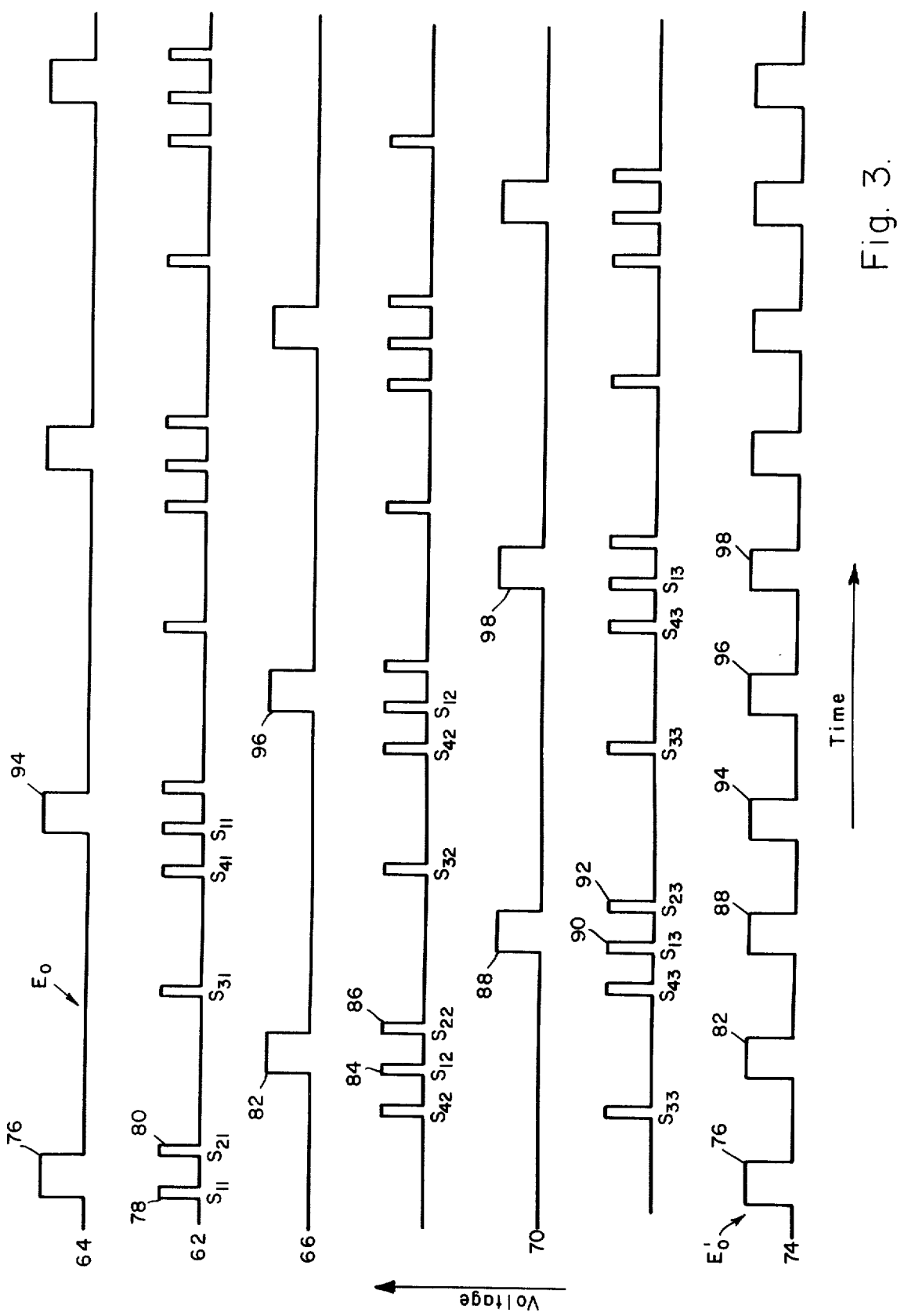
FIG. 3 is a diagram of voltage versus time waveforms which are useful for explaining the operation of the subject invention.

So as to clarify the description of the operation of a multiphase system, FIG. 3 illustrates the output pulses and the switch control signals (triggering pulses to the switches) which would be used for a pulse generator embodiment having three parallel pulse producing sections. Waveform 64 of FIG. 3 depicts the output pulses provided to the reactive load, e.g. a Pockels cell, by pulse producing section $\phi_1$; waveform 66 depicts the output pulses provided by sections $\phi_2$ (not specifically shown in FIG. 2) and waveform 70 the output pulses supplied by section $\phi_3$ (not specifically shown in FIG. 2). The combination of the output pulses provided by all of these sections is applied to the reactive load as a high frequency train of pulses such as depicted by waveform 74.

In the operation of the multisection embodiment of the invention, the first output pulse designated 76 in FIG. 3 is initiated by the triggering pulse labeled 78 and is terminated when the energy stored in the reactive load is transferred to capacitor 12 upon the application of the triggering pulse designated 80. The next pulse applied to the reactive load is indicated by reference numeral 82 in FIG. 3. This pulse, which is applied from the section $\phi_2$, is initiated by triggering pulse 84 and is terminated upon the application of triggering pulse 86. Similarly the third pulse applied to the reactive load is produced by section $\phi_3$ in response to triggering pulse 90 and is terminated in response to pulse 92. This completes one cycle of operation of a three-phase configuration of the subject pulse generator. As shown in FIG. 3, following the pulse produced by section $\phi_3$ the next pulse 94 is generated within section $\phi_1$ and the operation of the system continues with the pulse 96 provided by section $\phi_2$ and the pulse 98 by section $\phi_3$. It is noted that the multiphase configuration can be implemented so as to allow ample time for the switching units in each of the pulse producing section to recover before that section is again required to perform an " output pulse cycle."

For example, referring to section $\phi_1$ shown in FIG. 2, after recovery of switches 1 and 2 and prior to the need for an additional output pulse from section $\phi_1$, switch 3 is triggered in response to signal $S_{31}$ and thereby transfers the charge stored on capacitor 12 back to capacitor 10. This transfer of energy takes place sufficiently in advance of the next cycle of section 1 that switch 3 has time to recover before switches 1 and 2 of section $\phi_1$ are again enabled. Further, the transfer of energy from capacitor 12 to capacitor 10 is sufficiently prior to the start of a new cycle that switch 4 may be enabled and recover before the start of the next cycle, i.e., the enabling of switch 1. As noted above, the function of switch 4 after the initial charging of the capacitor is to supplement the charge stored on capacitor 10 so as to compensate for any loss of energy during the transfer of energy through the system. It is noted that normally the current through switch 4, and hence its recovery time, is small.

To summarize the above discussed operation in a timing sequence, section $\phi_1$ will supply a pulse to the reactive load in response to the enabling of switches 1 and 2 in rapid succession, the charge being transferred from capacitor 10 of section $\phi_1$ to the reactive load and from the load to capacitor 12. During the time between output pulses from section $\phi_1$ the charge is retained on capacitor 12 for approximately half the time that section $\phi_1$ is in a recovery condition and is then transferred to capacitor 10 through switch 3 for the other half of the time; thereby allowing ample time for each switch to recover before it is required to hold off voltage in its forward direction. The number of sections to be implemented may be chosen arbitrarily large so as to allow sufficient time for the recovery of the switches for each of the sections and yet obtain any arbitrarily high output pulse repetition frequency. SCR elements may be cascaded in each of the switching devices so that very high energy, high frequency pulse trains can be provided. For example, 1 kilovolt pulses with a 20 nanosecond rise time and with a 20 nanosecond fall time can be generated. The timing of the control signals to switches 1 and 2 in each section can be varied to vary the duty factor, i.e., pulse duration, of the output pulses.

Figure 4:
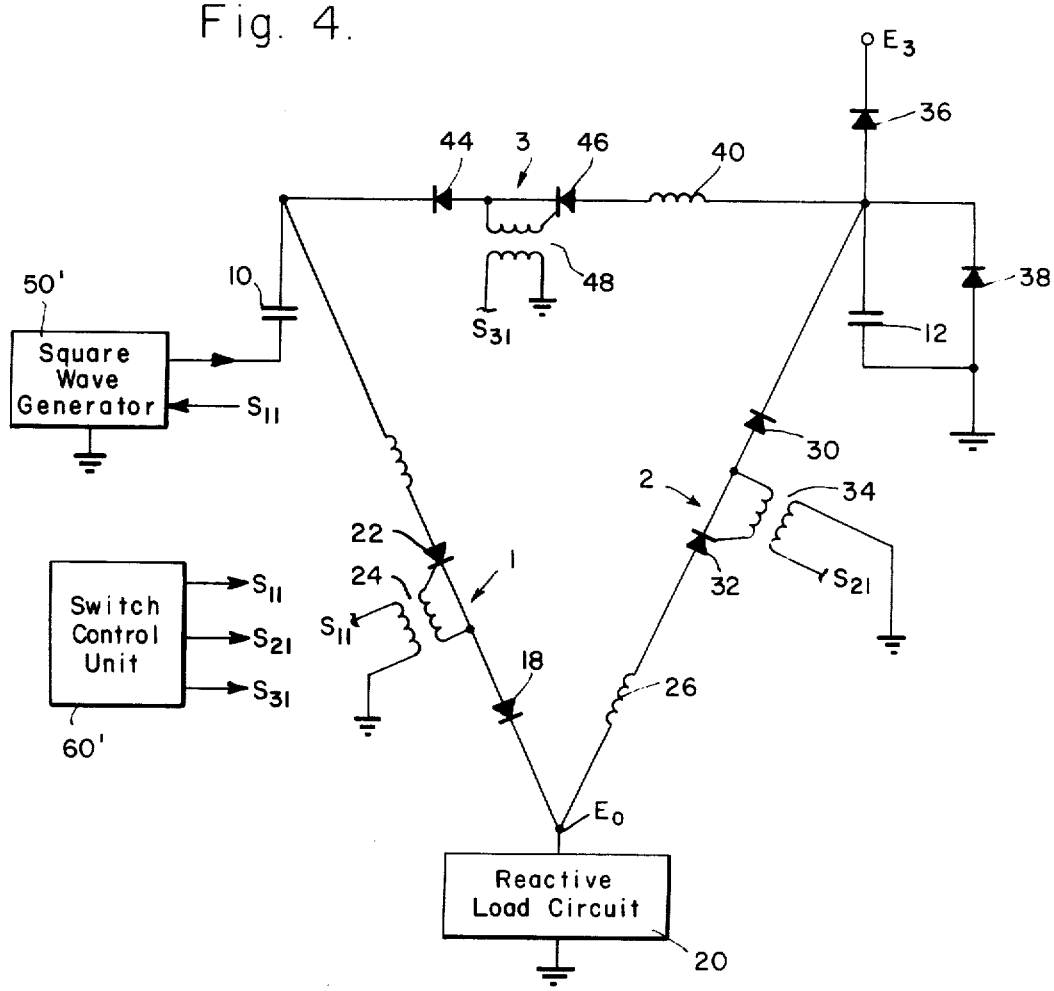
FIG. 4 is a block and schematic diagram of a third embodiment of the subject invention wherein a square wave generator is employed so as to provide the input energy requirements.

The structure of the embodiment of FIG. 4 differs from that described above relative to FIG. 1 inasmuch as in FIG. 4 the lower terminal of capacitor 10 is connected to the signal output terminal of a square wave generator 50'; and power source 50 and switch 4 are not required in the embodiment of FIG. 4.

Figure 5:
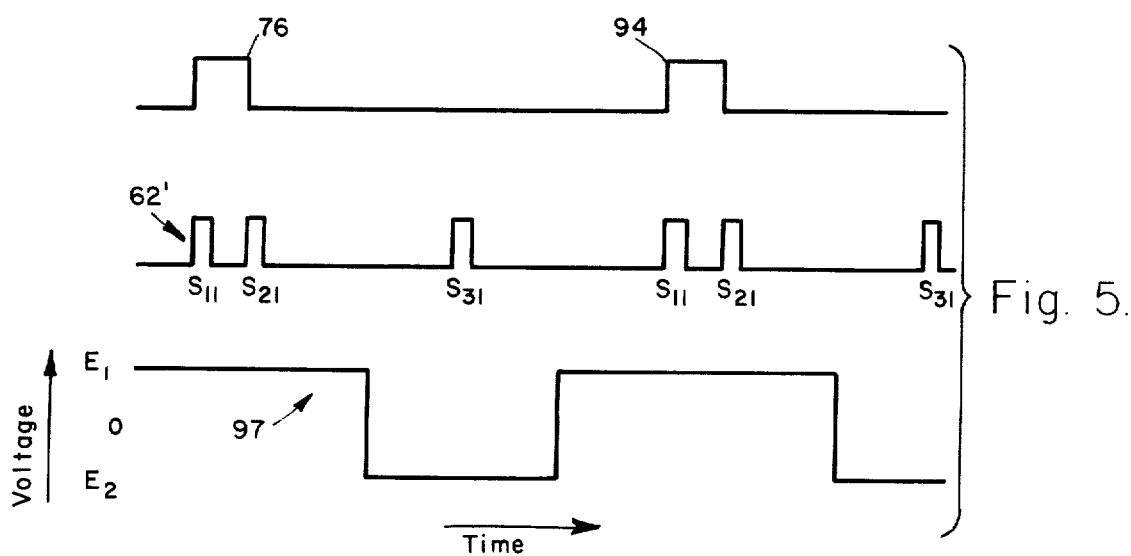
FIG. 5 is a diagram of voltage versus time waveforms which are useful for explaining the operation of the embodiment of FIG. 4.

The output signal produced by square wave generator 50' is illustrated by waveform 97 of FIG. 5 and the values of voltages $E_1$ and $E_2$ are selected such that $E_1$ and $E_2$ are each very much less than voltage $E_3$. The timing of the output signal from square wave generator 50' is such that the voltage $-E_2$ is applied to capacitor 10 during a period encompassing the time energy is transferred from capacitor 12 to capacitor 10 in response to trigger pulse $S_{31}$ (see waveforms 62' of FIG. 5). Also, as illustrated in FIG. 5 the output signal from square wave generator 50' is such that the voltage $+E_1$ is applied to capacitor 10 during a period encompassing the time energy is transferred from capacitor 10 to load 20 in response to trigger pulse $S_{11}$.

The negative potential ($-E_2$) applied to the lower terminal of capacitor 10 during the transfer of energy to capacitor 10 from capacitor 12 adds energy to the system as well as providing for a more complete transfer of energy from capacitor 12 to capacitor 10. The positive potential applied to the lower terminal of capacitor 10 during the transfer of energy from capacitor 10 to load 20 also adds energy to the system. The value of voltages $E_1$ and $E_2$ are selected such that the added amount of energy is slightly greater than energy losses during a corresponding operating period. The slight excess of added energy is removed by the clamp circuit which includes diode 36. Trigger pulse $S_{11}$ is applied to square wave generator 50' and in response thereto the output signal from square wave generator 50' is maintained in synchronism with the trigger pulses which control switches 1 through 3. "Triggered" square wave generators suitable for use as element 50' are well known in the art.

In the embodiment of FIG. 4, the initial charge on capacitor 10 is "built up" during a relatively short initial operating period of the pulse generator. In applications which require the output pulse to load 20 to be at full value before the end of such a "build up" period, an initial charge may be applied to capacitor 10 by a circuit similar to the configuration of elements 50 and 4 of FIG. 1.

In the embodiment of FIG. 4, voltage $E_3$ is slightly less than the output voltage $E_0$ and the potential levels of the signal from square wave generator 50' are very much smaller than the output signal $E_0$. One of the advantages of the embodiment of FIG. 4 is that the voltages $E_1$ and $E_2$ which provide energy to the pulse generator are relatively low potentials while the output signal to load 20 ($E_0$) is very high.

Thus having described a new and improved pulse generator for reactive loads, what is claimed is:

1. A pulse generator adapted for providing electric pulses to a reactive load circuit, said pulse generator comprising:

first and second electric energy storage circuits;

means for applying electric energy to said first energy storage circuit;

first energy transfer means for providing a transfer of electric energy from said first energy storage circuit to said reactive load circuit upon the application of an enabling signal to said first energy transfer means;

second energy transfer means for providing a transfer of electric energy from said reactive load circuit to said second energy storage circuit upon the application of an enabling signal to said second energy transfer means;

third energy transfer means for providing a transfer of electric energy from said second energy storage circuit to said first energy storage circuit upon the application of an enabling signal to said third energy transfer means;

switch control means for applying enabling signals to said first, second, and third energy transfer means during first, second, and third sequential time periods, respectively;

whereby electric energy stored in said first energy storage circuit is sequentially circulated to said reactive load circuit, to said second energy storage circuit and back to said first energy storage circuit, and whereby the duration of the pulse supplied to said reactive load circuit is a function of the interval between said first and second sequential time periods.

2. A pulse generator according to claim 1 and adapted for providing electric pulses to a capacitive type load, and wherein said first and second energy storage circuits comprise first and second capacitors, respectively.

3. A pulse generator according to claim 2 wherein the values of capacitance of said load circuit, said first capacitor and said second capacitor are substantially the same.

4. A pulse generator according to claim 2 wherein said first, second and third energy transfer means include first, second and third inductors, respectively; and wherein the values of said first, second and third inductors are such that the transfer of energy to and from said capacitors and the reactive load circuit is accomplished by resonant charging.

5. A pulse generator according to claim 1 wherein said means for applying electric energy to said first energy storage circuit comprises a power source; and fourth energy transfer means for providing a transfer of electric energy from said power source to said first energy storage circuit upon the application of an enabling signal to said fourth energy transfer means; and wherein said switch control means further comprises means for applying an enabling signal to said fourth energy transfer means during a fourth time period which follows said third time period; whereby supplemental charge is added to said first energy storage circuit so as to compensate for energy losses.

6. A pulse generator according to claim 2 wherein said means for applying energy to said first energy storage circuit comprises a square wave generator coupled to one terminal of said first capacitor.

7. A pulse generator according to claim 6 further comprising voltage clamping means coupled to one of said energy storage circuits such that the amount of energy stored therein is restricted to a preselected range of values.

8. A pulse generator according to claim 1 further comprising voltage clamping means coupled to one of said energy storage circuits such that the amount of energy stored therein is restricted to a preselected range of values.

9. A pulse generator according to claim 1 wherein each of said energy transfer means comprises a silicon controlled rectifier and a transformer, with the secondary winding of the transformer being electrically connected between the gate and cathode terminals of the associated silicon controlled rectifier.

10. A pulse generator according to claim 9 wherein each of said energy transfer means comprises a diode connected so as to be in series with the energy transferred by said energy transfer means.

11. A pulse generator adapted for providing electric pulses to a reactive load circuit, said pulse generator comprising:

a plurality of pulse producing sections, each section comprising first and second energy storage circuits, means for applying electric energy to said first energy storage circuit, first energy transfer means for providing a transfer of electric energy from said first energy storage circuit to said reactive load circuit upon the application of an enabling signal to said first energy transfer means, second energy transfer means for providing a transfer of electric energy from said reactive load circuit to said second energy circuit upon the application of an enabling signal to said second energy transfer means, and third energy transfer means for providing a transfer of electric energy from second energy storage circuit to said first energy storage circuit upon the application of an enabling signal to said third energy transfer means; and switch control means for applying enabling signals to said energy transfer means in each of said pulse producing sections during different sequential time periods such that electric energy stored in the first energy storage circuit of a particular pulse producing section is sequentially circulated to said reactive load circuit, then to the corresponding second energy storage circuit and back to the corresponding first energy storage circuit, and with the timing of the control of the energy transfer means being such that each of said sections provide a pulse to the reactive load circuit during a different time interval of each cycle of operation of said pulse generator.

12. A pulse generator according to claim 11 and adapted for providing electric pulses to a capacitive type load, and wherein the first and second energy storage circuits in each said pulse producing sections comprise first and second capacitors, respectively.

13. A pulse generator according to claim 12 wherein the values of capacitance of said load circuit, said first capacitor and said second capacitor are substantially the same.

14. A pulse generator according to claim 12 wherein said first, second and third energy transfer means include first, second and third inductors, respectively; and wherein the values of said first, second and third inductors are such that the transfer of energy to and from said capacitors and the reactive load circuit is accomplished by resonant charging.

15. A pulse generator according to claim 11 wherein said means for applying electric energy to said first energy storage circuit comprises a power source and wherein each of said pulse producing sections comprises fourth energy transfer means for providing a transfer of electric energy from said power source to said first energy storage circuit upon the application of an enabling signal to said fourth energy transfer means; and wherein said switch control means further comprises means for applying an enabling signal to said fourth energy transfer means during a time period which follows the transfer of electric energy from said second energy storage circuit to said first energy storage circuit; whereby supplemental charge is added to said first energy storage circuit so as to compensate for energy losses.

16. A pulse generator according to claim 12 wherein said means for applying electric energy to said first energy storage circuit comprises a square wave generator coupled to one terminal of said first capacitor.

17. A pulse generator according to claim 11 wherein each of said pulse producing sections further comprises voltage clamping means coupled to one of said energy storage circuits such that the amount of energy stored therein is restricted to a preselected range of values.

18. A pulse generator according to claim 11 wherein each of said energy transfer means comprises a silicon controlled rectifier and a transformer, with the secondary winding of the transformer being coupled between the gate and cathode terminals of the associated silicon controlled rectifier.

19. A pulse generator according to claim 11 wherein each of said energy transfer means includes a diode connected so as to be in series with the energy transferred by said energy transfer means.

* * * * *